(12) United States Patent
Cho et al.

(10) Patent No.: US 7,012,834 B2
(45) Date of Patent: Mar. 14, 2006

(54) WRITING DRIVER CIRCUIT OF PHASE-CHANGE MEMORY

(75) Inventors: Beak-hyung Cho, Osan (KR); Woo-yeong Cho, Kyungki-do (KR); Hyung-rok Oh, Seongnam (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/829,807

(22) Filed: Apr. 22, 2004

(65) Prior Publication Data

US 2004/0246808 A1  Dec. 9, 2004

(30) Foreign Application Priority Data

Jun. 3, 2003  (KR) ............... 10-2003-0035607

(51) Int. Cl.
*G11C 7/00* (2006.01)

(52) U.S. Cl. ............. 365/163; 365/189.05; 365/189.11

(58) Field of Classification Search ................ 365/113, 365/163, 158, 175, 189.05, 189.11
See application file for complete search history.

(56) References Cited

U.S. PATENT DOCUMENTS

| 6,590,807 B1 * | 7/2003 | Lowrey ................... 365/175 |
| 6,768,665 B1 * | 7/2004 | Parkinson et al. ........ 365/113 |

* cited by examiner

*Primary Examiner*—Son T. Dinh
(74) *Attorney, Agent, or Firm*—F. Chau & Associates, LLC

(57) ABSTRACT

A writing driver circuit of a phase-change memory array which has a pulse selection circuit, a current control circuit, and a current drive circuit. The current control circuit receives a bias voltage, outputs a control signal at a second level during an enable duration of the reset pulse when the data is at a first level, and outputs a control signal at a first level during an enable duration of the set pulse when the data is at a second level. The current drive circuit outputs writing current to the phase-change memory array during the enable duration of the reset pulse or the set pulse. The writing driver circuit can select the reset pulse or the set pulse according to the logic level of the data, and control the level of current applied to the phase-change memory array according to the reset pulse or the set pulse.

20 Claims, 5 Drawing Sheets

WRITING DRIVER CIRCUIT OF PHASE-CHANGE MEMORY

BACKGROUND OF THE INVENTION

1. Field of the Invention

The present invention relates to a phase-change memory device, providing nonvolatile memory for FLASH memory, embedded memory, and DRAM. More particularly, a pulse-writing driver circuit for writing data in a phase-change random-access memory (PRAM) array.

2. Description of the Related Art

A phase-change random access memory (PRAM), also known as ovonic or chalcogenide memory, is a non-volatile memory device which stores data using a phase-change material, (e.g., chalcogenide amorphous semiconductors, such as Ge—Sb—Tb (GST)). PRAM has all the advantages of a dynamic random access memory (DRAM) and also has non-volatile and low power consumption properties. Phase-change memories use current to heat up a ceramic alloy of germanium, antimony and tellurium: Ge2Sb2Te5, or GST. A bit is represented by changing the phase of the GST chalcogenide material from a resistive amorphous state, referred to as the reset state, to a crystalline state, called the set state.

When a write operation is performed, current that flows through the phase-change material GST, can transform the phase-change material GST into a crystalline (conducting) state or an amorphous (high resistance) state.

Whether the phase-change material GST is transformed into a crystalline state or an amorphous state is determined by the magnitude of current flowing in the phase-change material GST and the timing of that current. When strong current flows in the phase-change material GST for a short period of time, (followed by a rapid quench period) the phase-change material GST is transformed into an amorphous (high resistance) state. The amorphous state is referred to as a reset state and corresponds to data "1".

When current weaker than the reset current flows in the phase-change material GST for a longer period of time, the phase-change material GST is transformed into a crystalline (conducting) state, which is referred to as a set state and corresponds to data "0".

FIG. 1 is an equivalent circuit diagram of a PRAM (phase-change random access memory) memory cell.

A PRAM memory cell 100 operates by converting a small volume of the chalcogenide (variable resistor GST) material back and forth between the crystalline and amorphous phases and includes one switch (transistor) TR and one variable resistor GST. The variable resistor is a phase-change material (e.g., Ge—Sb—Tb). A word line WL is connected to control the transistor TR, and a bit line BL is connected to supply current through the phase-change material GST (and through the transistor TR when it is conducting).

The phase-change material GST has the physical property that its resistively is changed by orders of magnitude (e.g., by $10^3$) as it is transformed from an amorphous state to a crystalline state. The phase-change material GST becomes crystalline or amorphous depending on temperature and heating time and cooling (quench) time, so as to store information.

For a phase-change of the phase-change material GST, a temperature higher than 900° C. is generally necessary. The phase-change is achieved by Joule Heating using current applied to the phase-change material (GST resistor) of a memory cell 100.

In a write operation, a GST resistor in a memory cell 100 may be transformed into an amorphous (high resistance) state by performing the steps of: causing write current "i" to flow through the phase-change material (GST resistor), heating the phase-change material (GST resistor) to a melting temperature Tm, and fast quenching the phase-change material GST. Rapid cooling of the material to below its glass transition temperature causes the material to be locked into its amorphous phase. Accordingly, the phase-change material (GST resistor) stores information "1" in its amorphous state. Such an amorphous state is referred to as a reset state.

To switch the phase-change memory element (GST resistor) back to its conductive state, the material is heated to a temperature between the glass transition temperature and the melting temperature, causing nucleation and crystal growth to rapidly occur over a period of several nanoseconds. A GST resistor in a memory cell 100 may be transformed into a crystalline (conducting) state by performing the steps of causing write current "ii" to flow in the phase-change material GST, heating the phase-change material GST to at least a crystallization temperature Tc, maintaining the temperature of the GST material at crystallization temperature Tc for a predetermined period of time (for allowing the formation of crystals in the GST material), and quenching the phase-change material GST. Accordingly, the phase-change material (GST resistor) stores information "0" in a crystalline state. Such a crystalline state is referred to as a set state.

The phase-change material GST becomes crystalline (set) or amorphous (reset) according to data-controlled current supplied from the outside the memory cell 100. The resulting phase-change is dependant upon the magnitude of write-current and the width (duration) of the write-current pulse. Current necessary for amorphousness is called reset current "i" and current necessary for crystallization is called set current "ii". The magnitude of the reset current "i" is generally greater than the magnitude of the set current "ii", and the time for applying the reset current "i" is shorter than time for applying the set current "ii". It is possible to write to the memory device at pulse durations of nanoseconds.

In a read operation, a bit line and a word line are selected and a specific memory cell 100 is selected. Next, current flows from the outside and a voltage potential according to the resistance of the phase-change material GST is measured using a sense-amplifying circuit (not shown), such that the stored information ("1" or "0") is determined.

FIG. 3 is a block diagram of a conventional pulse-write circuitry for a general write operation in a phase-change memory device.

FIG. 4 is a timing diagram of the pulse-write operation in the phase-change memory device of FIGS. 1 and 3.

Referring to FIG. 3, a word line (WL of FIG. 1) is selected by a row selector 320 which receives a row address, and a bit line (BL of FIG. 1) is selected by a column selector 340 which receives a column address. A phase-change (PRAM) memory cell (100 in FIG. 1) within the array 310 is selected by the word line and the bit line and stores a "1" or a "0" in response to data-controlled current supplied from the outside the memory cell (100).

The pulse-write operation of a conventional phase-change memory device 300 will be described in further detail with reference to signal timing depicted in FIG. 4. A data buffer 350 receiving data DATA generates a write control signal WMDL. The write control signal WMDL has the same logic level as the data DATA.

A control logic 360 responds to control signals /CS, /WE, /UB, /LB, and /OE input from the outside to generate a driver control signal PWD which controls a write-current driver 330. When the driver control signal PWD is a high level, the write-current driver 330 is operated.

The driver control signal PWD has a different pulse width depending upon whether the data DATA is "1" or "0". This is because time needed to transform the phase-change material GST into a crystalline state is different from time needed to transform the phase-change material GST into an amorphous state as described above.

When the write control signal WMDL is a high level and the driver control signal PWD is a high level, the bit line applies reset current to a memory cell (100) within the phase-change memory (PRAM) array 310. When the write control signal WMDL is a low level and the driver control signal PWD is a high level, the bit line applies set current to the memory cell (100) within the phase-change memory array 310.

As explained above, to store data DATA (e.g., "1" or "0") in the phase-change memory device, both the writing current and duration of its application will be controlled according to the data DATA to be written.

SUMMARY OF THE INVENTION

A writing driver circuit is provided that writes data into a memory cell (e.g., 100 of FIG. 1) within a phase-change memory device.

According to an aspect of the present invention, there is provided a writing driver circuit comprising a pulse selection circuit, a current control circuit, and a current drive circuit.

The pulse selection circuit outputs either of a reset pulse and a set pulse in response to a logic level of data and the data. The current control circuit receives a bias voltage, outputs a control signal at a second control level during an enable duration of the reset pulse when the data is at a first data level, and outputs the control signal at a first control level during an enable duration of the set pulse when the data is at a second data level.

The current drive circuit outputs writing current to the phase-change memory array through a first node in response to the control signal during the enable duration of the reset pulse or the set pulse, and discharges the first node during a disable duration of the reset pulse or the set pulse.

The level of the control signal may increase or decrease in response to a change of the bias voltage. The reset pulse and the set pulse may be current pulses. The enable duration of the reset pulse may be shorter than the enable duration of the set pulse.

A level of the writing current when the reset pulse is selected in the pulse selection circuit may be higher than a level of the writing current when the set pulse is selected in the pulse selection circuit.

The pulse selection circuit may include a first transmitter, a second transmitter, a buffer, and a first inverter. The first transmitter may output the reset pulse in response to a logic level of the data. The second transmitter may output the set pulse in response to a logic level of the data.

The buffer may buffer the data and outputs the buffered data to the current control circuit. The first inverter may invert an output of the first transmitter or the second transmitter and apply the inverted output to the current drive circuit.

The first transmitter and the second transmitter may be transmission gates which are turned on or off in response to the data and the inverted data, and when either of the first transmitter and the second transmitter may be turned on, the other may be turned off.

The buffer may include a second inverter which inverts the data to generate the inverted data, and a third inverter may invert the inverted data and outputs the data to the current control circuit.

The current control circuit may include a first transistor, a first level controller, a second level controller, a first control transistor, and a second control transistor.

The first transistor may have a source connected to a first voltage and a gate and a drain of the first transistor connected to each other. The first level controller may be turned on in response to the bias voltage and control the level of the control signal.

The second level controller may control the control signal to be generated at a first control level or a second control level in response to the data output from the pulse selection circuit. The first control transistor may control operation of the current control circuit in response to the reset pulse or the set pulse.

The second control transistor may turn off the first transistor during the disable duration of the reset pulse or the set pulse and output the control signal at a third control level.

The first level controller may include a first level transistor and a second level transistor which are connected in series between a drain of the first transistor and a drain of the first control transistor, the bias voltage being applied to gates of the first level transistor and the second level transistor, and the second level controller may include a third level transistor and a fourth level transistor which are connected in series between the drain of the first transistor and the drain of the first control transistor, the data being applied to gates of the third level transistor and the fourth level transistor.

The first control transistor may have a drain commonly connected to sources of the second and fourth level transistors, a source connected to a second voltage, and a gate to which the reset pulse or the set pulse is applied, and the second control transistor may have a source connected to a first voltage, a drain connected to the drain of the first transistor, and a gate to which the reset pulse or the set pulse is applied.

The first through fourth level transistors may be NMOS transistors, the first control transistor may be an NMOS transistor, the second control transistor may be a PMOS transistor, and the first transistor may be a PMOS transistor.

The current drive circuit may include a pull up transistor having a source connected to the first voltage, a drain connected to the first node, and a gate to which the control signal is applied, and a pull down transistor having a drain connected to the first node, a source connected to the second voltage, and a gate to which an inverted reset pulse or an inverted set pulse is applied.

The second control level of the control signal may be a voltage level which can turn on the pull up transistor stronger than the first control level of the control signal, and the third control level of the control signal may be a voltage level which can turn off the pull up transistor.

According to another aspect of the present invention, there is provided a writing driver circuit of a phase-change memory array, comprising a pulse selection circuit, a current control circuit, and a current drive circuit.

The pulse selection circuit outputs either one of a reset pulse and a set pulse in response to a logic level of data and outputs an inverted data. The current control circuit receives a bias voltage, the data and the selected one of a reset pulse and a set pulse, and outputs a control signal at a second level when the data is at a first data level during an enable duration of the reset pulse, and outputs a control signal at a first control level when the data is at a second data level during an enable duration of the set pulse, and outputs a control signal at a third control level during a disable duration of the reset pulse or the set pulse.

The current drive circuit outputs writing current at a first control level or a second control level to the phase-change memory array through a first node during an enable duration of the reset pulse or the set pulse in response to a logic level of the inverted data, and discharges the first node during a disable duration of the reset pulse or the set pulse.

Another aspect of the present invention provides, a writing driver circuit of a phase-change memory array, comprising: a pulse selection circuit that receives a reset pulse and a set pulse and outputs a selected one of the reset pulse and the set pulse in response to the logic level of data; a current drive circuit that outputs writing current at a first level or a second level to the phase-change memory array during an enable duration of the reset pulse or the set pulse respectively. The current drive circuit includes a first pull-up transistor and a second pull-up transistor connected in parallel between a first voltage and a first node; the current drive circuit outputs writing current at the first level when the first pull-up transistor is activated during an enable duration of the reset pulse; the current drive circuit outputs writing current at the second level when the first pull-up transistor and the second pull-up transistor is activated during an enable duration of the set pulse.

BRIEF DESCRIPTION OF THE DRAWINGS

The preferred embodiments of the present invention will be described in detail with reference to the attached drawings in which.

DETAILED DESCRIPTION OF PREFERRED EMBODIMENTS

The present invention will now be described more fully with reference to the accompanying drawings, in which preferred embodiments of the invention are shown.

Figure 1:
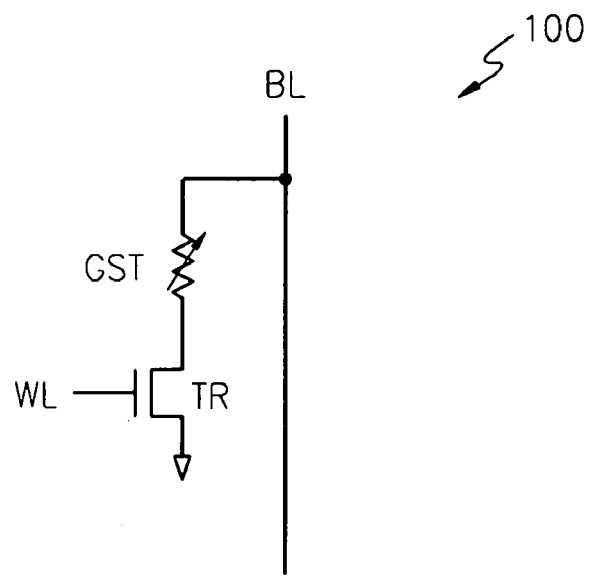
FIG. 1 is a diagram of an equivalent circuit of a phase-change random access memory (PRAM) cell.
Figure 2:
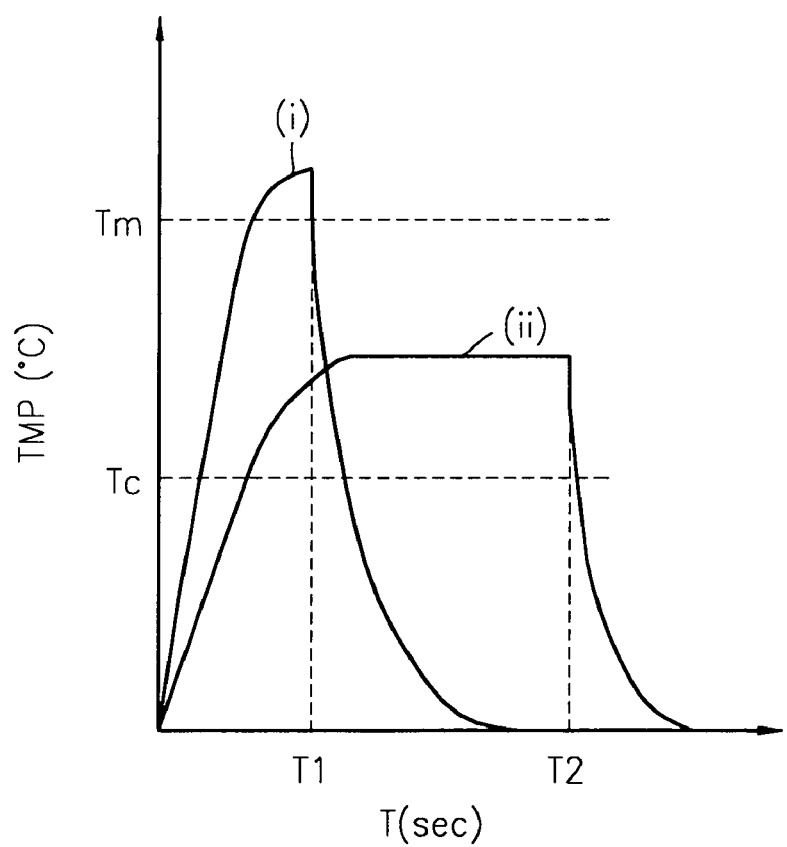
FIG. 2 is a time-current graph illustrating the operative currents used for writing data in a phase-change material.
Figure 3:
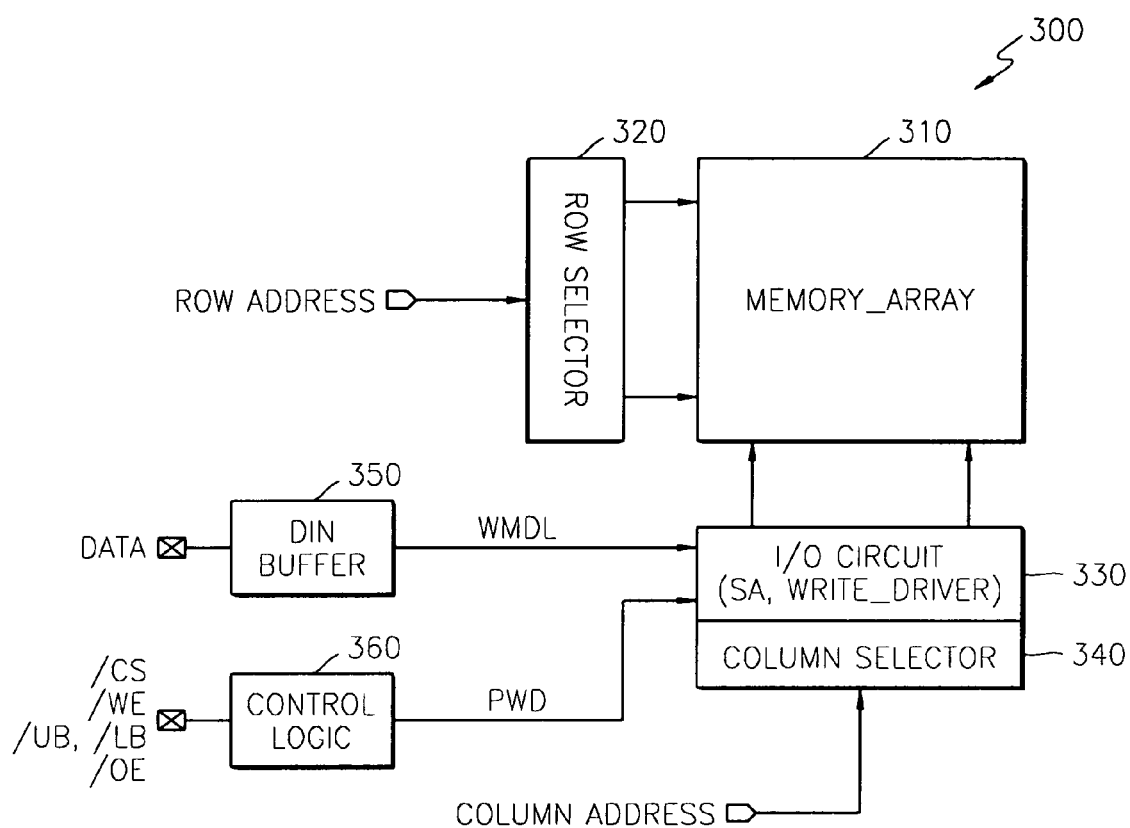
FIG. 3 is a block diagram of a conventional pulse-writing circuit for performing a write operation in a phase-change memory (PRAM) device.
Figure 4:
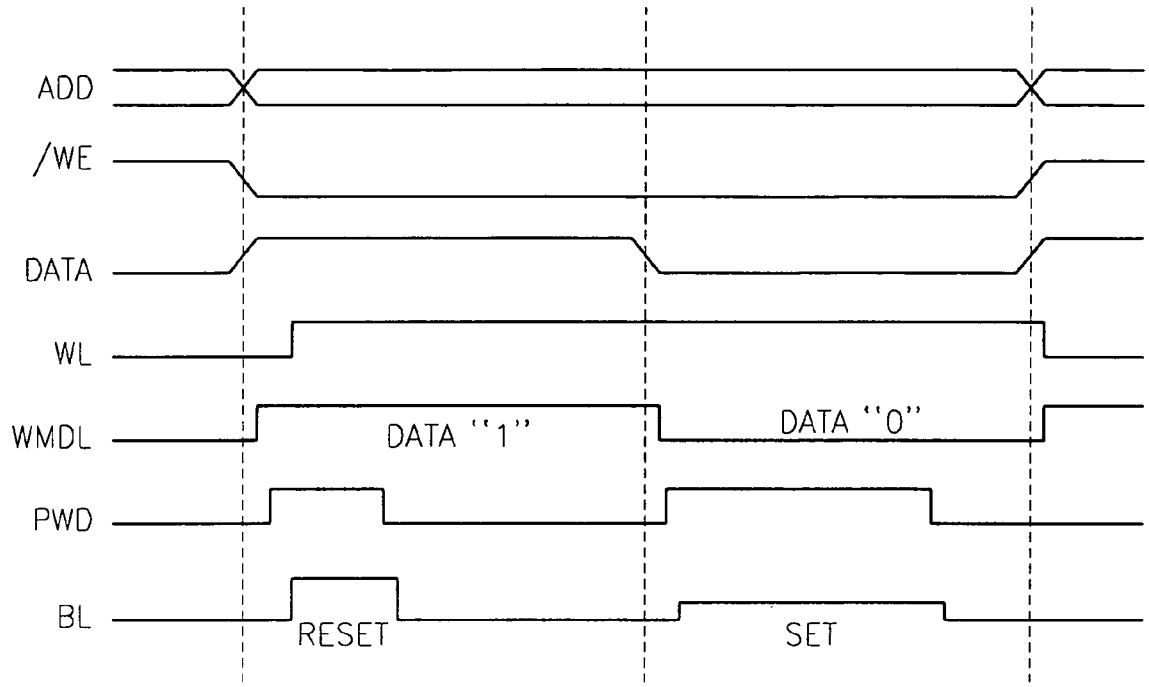
FIG. 4 is a timing diagram illustrating control signals used in the write operation in the pulse-writing circuit of FIG. 3.
Figure 5:
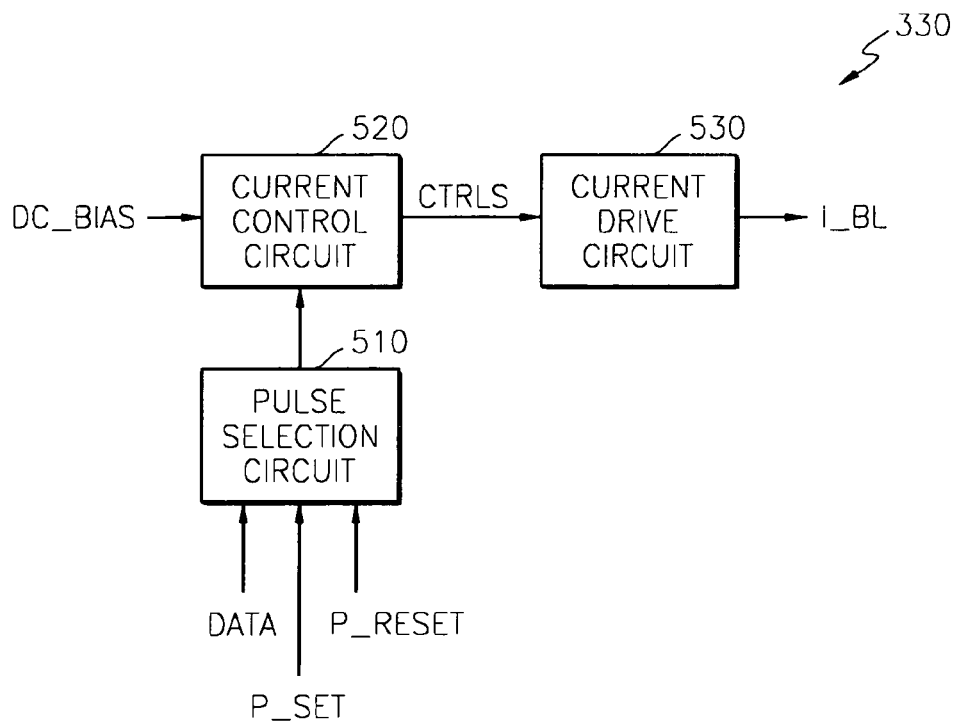
FIG. 5 is a block diagram of a writing driver circuit according to a first preferred embodiment of the present invention.

FIG. 5 is a block diagram of a writing driver circuit according to a first preferred embodiment of the present invention.

Referring to FIG. 5, the writing driver circuit 330 includes a pulse selection circuit 510, a current control circuit 520, and a current drive circuit 530. The pulse selection circuit 510 outputs either of a reset pulse P_RESET and a set pulse P_SET in response to a logic level of data DATA and the data DATA.

The pulse selection circuit 510 functions to selectively apply the reset pulse P_RESET or the set pulse P_SET to the current control circuit to write "1" or "0" in a selected cell of a phase-change memory array.

Here, the reset pulse P_RESET and the set pulse P_SET are voltage pulses. An enable duration of the reset pulse P_RESET is shorter than an enable duration of the set pulse P_SET.

The current control circuit 520 receives a bias voltage DC_BIAS, outputs a control signal CTRLS at a second level during the enable duration of the reset pulse P_RESET when the data DATA is at a first level, and outputs a control signal CTRLS at a first level during the enable duration of the set pulse P_SET when the data DATA is at a second level.

The current control circuit 520 functions to control the amount of current supplied to the current drive circuit 530 during the enable duration of the reset pulse P_RESET or the set pulse P_SET. A level of writing current corresponding to the reset pulse P_RESET is higher than a level of writing current corresponding to the set pulse P_SET.

The bias voltage DC_BIAS has a constant voltage, and helps the current control circuit 520 to be performed stably. A voltage level of the bias voltage DC_BIAS can be changed through an external option PAD.

The level of writing current corresponding to the reset pulse P_RESET or the set pulse P_SET is changed depending on the level of the bias voltage DC_BIAS. Thus, the writing driver circuit 330 can increase or decrease the level of the control signal CTRLS in response to a change of the bias voltage DC_BIAS.

The current drive circuit 530 outputs writing current I_BL to the phase-change memory array through a first node N1 in response to the control signal during the enable duration of the reset pulse P_RESET or the set pulse P_SET, and discharges the first node N1 during a disable duration of the reset pulse P_RESET or the set pulse P_SET.

Figure 6:
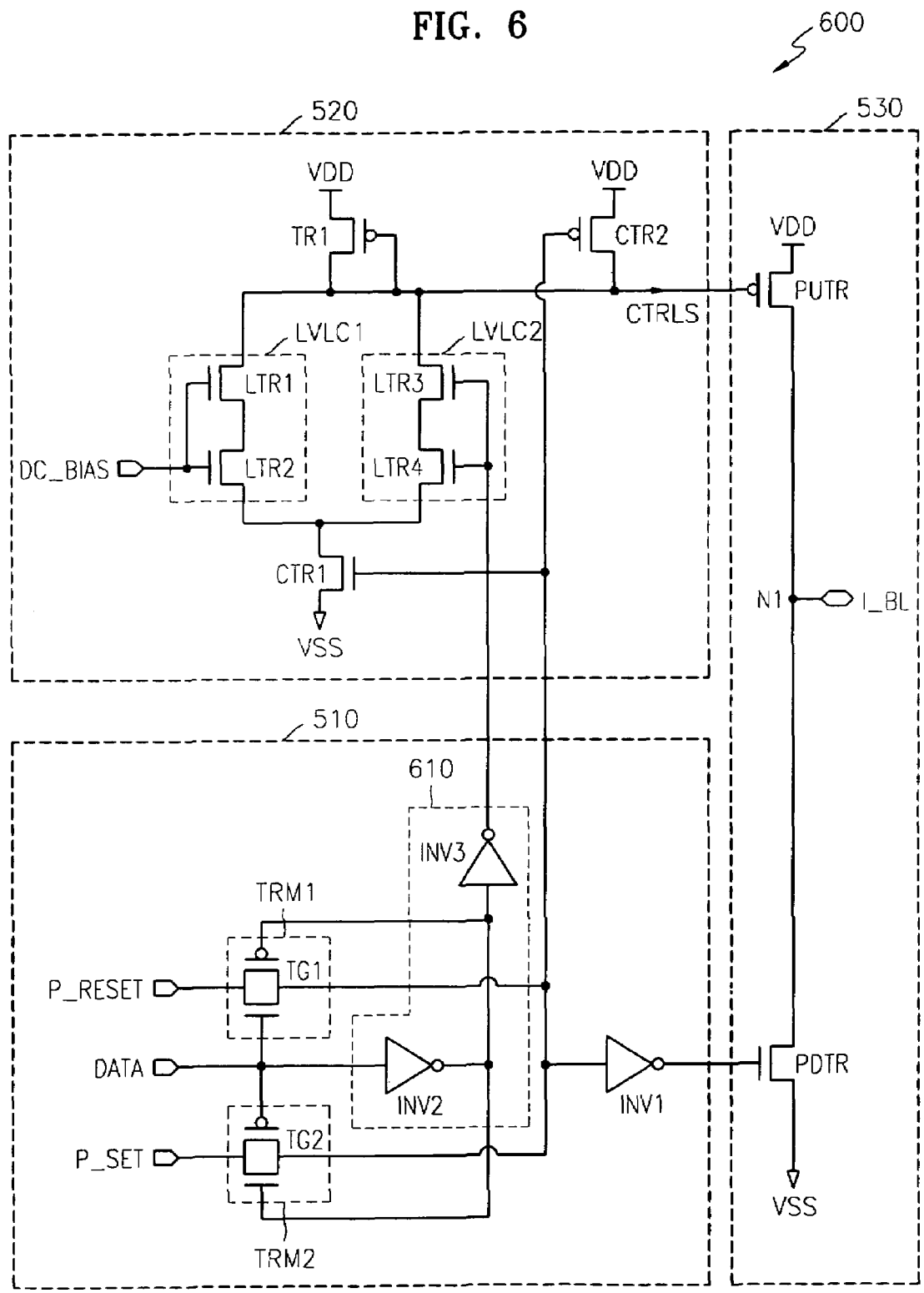
FIG. 6 is a circuit diagram of the writing driver circuit of FIG. 5.

FIG. 6 is a circuit diagram of the writing driver circuit of FIG. 5.

Referring to FIG. 6, the pulse selection circuit 510 includes a first transmitter TRM1, a second transmitter TRM2, a buffer 610, and a first inverter INV1.

The first transmitter TRM1 outputs the reset pulse P_RESET in response to a logic level of the data DATA. The second transmitter TRM2 outputs the set pulse P_SET in response to a logic level of the data DATA. The first transmitter TRM1 and the second transmitter TRM2 include transmission gates TG1 and TG2, respectively, which are turned on or off in response to the data DATA and inverted data.

When either of the first transmitter TRM1 and the second transmitter TRM2 is turned on, the other is turned off. The buffer 610 buffers the data DATA and outputs the buffered data to the current control circuit 520. The buffer 610 includes a second inverter INV2 which inverts the data DATA to generate inverted data DATA, and a third inverter INV3 which inverts the inverted data DATA and outputs the data DATA to the current control circuit 520.

The first inverter INV1 inverts output of the first transmitter TRM1 or of the second transmitter TRM2, and outputs the inverted output to the current drive circuit 530.

For convenience in description, the first data level of the data DATA is a high level and the second data level of the data DATA is a low level. When the data DATA is at a high level, the transmission gate TG1 of the first transmitter TRM1 is turned on, and the transmission gate TG2 of the second transmitter TRM2 is turned off. Next, the first transmitter TRM1 applies the reset pulse P_RESET to the current control circuit 520, and the first inverter INV1 applies an inverted signal of the reset pulse P_RESET to the current drive circuit 530.

In contrast, when the data DATA is at a low level, the transmission gate TG2 of the second transmitter TRM2 is turned on, and the transmitter TG1 of the first transmitter TRM1 is turned off. Next, the second transmitter TRM2 applies the set pulse P_SET to the current control circuit 520, and the first inverter INV1 applies an inverted signal of the set pulse P_SET to the current drive circuit 530.

The current control circuit 520 includes a first transistor TR1, a first level controller LVLC1, a second level controller LVLC2, a first control transistor CTR1, and a second control transistor CTR2.

The first transistor TR1 has a source connected to a first voltage VDD, and a gate and a drain connected to each other. The first transistor TR1 is a PMOS transistor. The first level controller LVLC1 is turned on in response to the bias voltage DC_BIAS and controls the level of the control signal CTRLS.

In further detail, the first level controller LVLC1 includes a first level transistor LTR1 and a second level transistor LTR2 that are connected in series between a drain of the first transistor TR1 and a drain of the first control transistor CTR1. The bias voltage DC_BIAS is applied to gates of the first level transistor LTR1 and the second level transistor LTR2.

The second level controller LVLC2 controls the control signal CTRLS to be generated at a first level or a second level in response to the data DATA output from the pulse selection circuit 510. The second level controller LVLC2 includes a third level transistor LTR3 and a fourth level transistor LTR4 that are connected in series between the drain of the first transistor TR1 and the drain of the first control transistor CTR1. The data DATA is applied to gates of the third level transistor LTR3 and the fourth level transistor LTR4. The first through fourth level transistors LTR1, LTR2, LTR3, and LTR4 are NMOS transistors.

The first control transistor CTR1 controls operation of the current control circuit 520 in response to the reset pulse P_RESET or the set pulse P_SET. The first control transistor CTR1 has a drain commonly connected to sources of the second level transistor LTR2 and the fourth level transistor LTR4, a source connected to a second voltage VSS, and a gate to which the reset pulse P_RESET or the set pulse P_SET is applied. The first control transistor CTR1 is an NMOS transistor.

The second control transistor CTR2 turns off the first transistor TR1 during the disable duration of the reset pulse P_RESET or the set pulse P_SET, and outputs the control signal CTRLS at a third level. The second control transistor CTR2 has a source connected to a first voltage VDD, a drain connected to a drain of the first transistor TR1, and a gate to which the reset pulse P_RESET or the set pulse P_SET is applied. The second control transistor CTR2 is a PMOS transistor.

The current drive circuit 530 includes a pull up transistor PUTR and a pull down transistor PDTR. The pull up transistor PUTR has a source connected to a first voltage VDD, a drain connected to a first node N1, and a gate to which the control signal CTRLS is applied.

The pull down transistor PDTR has a drain connected to the first node N1, a source connected to a second voltage VSS, and a gate to which an inverted signal of the reset pulse P_RESET or the set pulse P_SET is applied.

The pull down transistor PDTR is turned off and the pull up transistor PUTR is turned on during the enable duration of the reset pulse P_RESET or the set pulse P_SET. The degree to which the pull up transistor PUTR is turned on is controlled according to the level of the control signal CTRLS, and accordingly the amount of writing current I_BL applied to the phase-change memory array in a set pulse and in a reset pulse is adjustable and can be externally adjusted.

The pull up transistor PUTR is turned off and the pull down transistor PDTR is turned on during the disable duration of the reset pulse P_RESET or the set pulse P_SET. The first node N1 from which the writing current I_BL is output is connected to the second voltage VSS and discharged.

The first level controller LVLC1 is turned on in response to the bias voltage DC_BIAS. When the data DATA is applied at a second level, namely, a low level, the set pulse P_SET is applied to the first control transistor CTR1 and the second control transistor CTR2 of the current control circuit 520. During the enable duration of the set pulse P_SET, the first control transistor CTR1 is turned on and the second control transistor CTR2 is turned off and the first transistor TR1 is turned on.

The third level transistor LTR3 and the fourth level transistor LTR4 of the second level controller LVLC2 are turned off in response to the data DATA of a low level. When the first control transistor CTR1, and the first level transistor LTR1 and the second level transistor LTR2 are turned on, the control signal CTRLS is generated at a first level, such that the pull up transistor PUTR is turned on. Here, the first control level of the control signal CTRLS is a low level.

During the enable duration of the set pulse P_SET, the pull up transistor PUTR is turned on and the pull down transistor PDTR is turned off. During the disable duration of the set pulse P_SET (when the set pulse P_SET is disabled), the second control transistor CTR2 is turned on and the control signal CTRLS is generated at a high level. The pull up transistor PUTR is turned off and the pull down transistor PDTR is turned on, thereby discharging the first node N1 to the VSS (e.g., ground) voltage level. When the data DATA is applied at a first level, namely, a high level, the reset pulse P_RESET is applied to the first control transistor CTR1 and the second control transistor CTR2 of the current control circuit 520. During the enable duration of the reset pulse P_RESET, the first control transistor CTR1 is turned on and the second control transistor CTR2 is turned off and the first transistor TR1 is turned on.

The third level transistor LTR3 and the fourth level transistor LTR4 of the second level controller LVLC2 are turned on in response to the data DATA of a high level. When the first control transistor CRT1, and the first through fourth level transistors LTR1, LTR2, LTR3, and LTR4 are all turned on, the control signal CTRLS is generated at a second level, such that the pull up transistor PUTR is turned on. Here, the second control level of the control signal CTRLS is a low level, which is lower than the first control level of the control signal CTRLS previously described.

Therefore, when the data DATA is at a high level, the control signal CTRLS becomes a lower level. As a consequence, the level of the control signal CTRLS further decreases and the pull up transistor PUTR of the current drive circuit 530 is turned on more, compared with a case where only the first and second level transistors LTR1 and LTR2 are turned on. The level of the writing current I_BL becomes higher than when the data DATA is at a low level.

Thus, when the data DATA is at a high level, the reset pulse P_RESET is applied to the current control circuit 520. In this case, the level of writing current I_BL is higher than the level of writing current in the case where the set pulse P_SET is applied to the current control circuit 520 when the data DATA is at a low level.

During the disable duration of the set pulse P_SET or the reset pulse P_RESET, the second control transistor CTR2 is turned on and the control signal CTRLS is generated at a third level, namely, a high level and the pull up transistor PUTR is turned off. At this time, since the pull down transistor PDTR is turned on, the first node N1 is discharged to the second voltage VSS.

Figure 7:
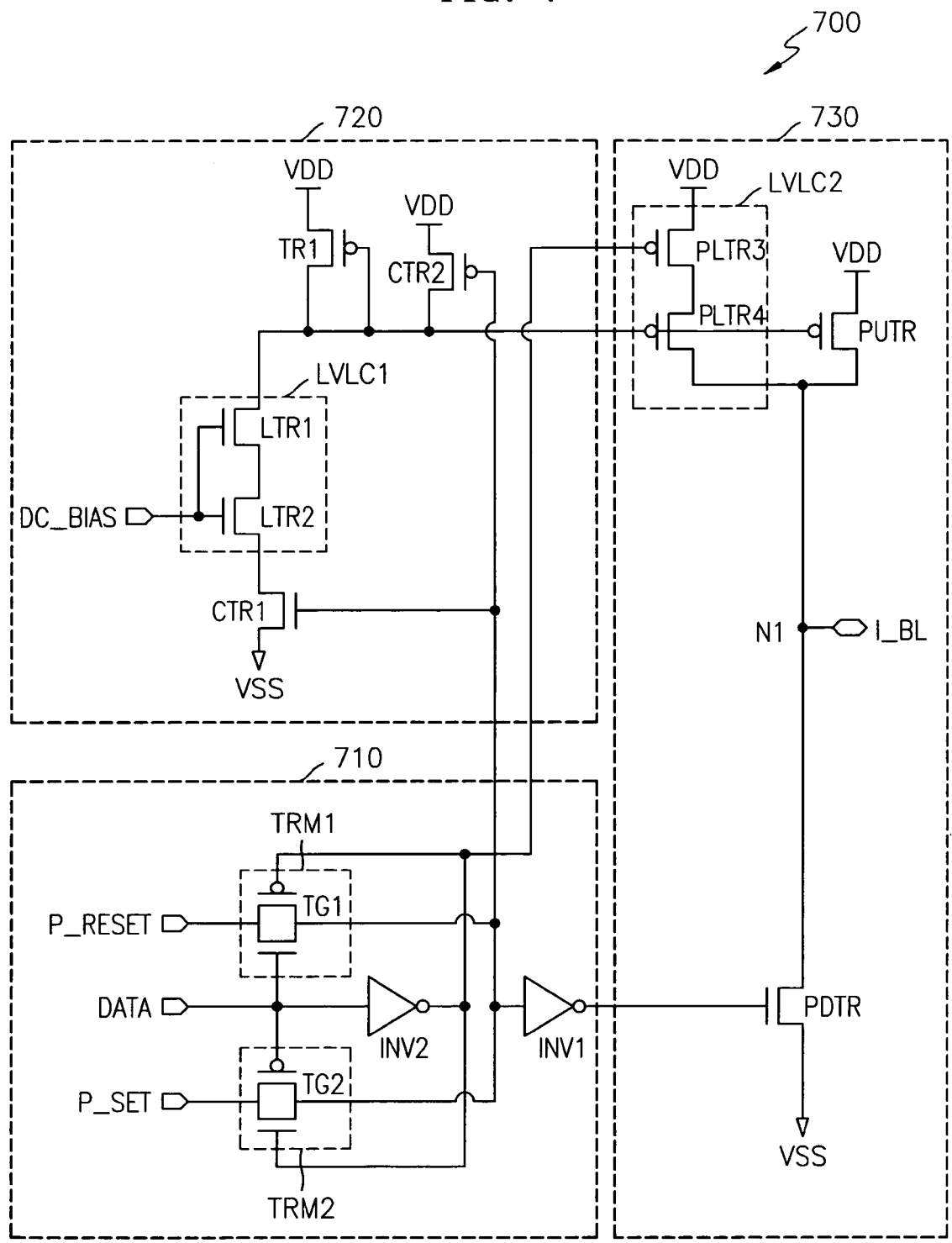
FIG. 7 is a circuit diagram of a writing driver circuit according to a second preferred embodiment of the present invention.

FIG. 7 is a circuit diagram of a writing driver circuit according to a second preferred embodiment of the present invention.

Referring to FIG. 7, the writing driver circuit 700 includes a pulse selection circuit 710, a current control circuit 720, and a current drive circuit 730.

The pulse selection circuit 710 receives a reset pulse P_RESET and a set pulse P_SET and outputs a selected one of the reset pulse P_RESET and a set pulse P_SET in response to the logic level of data DATA, and outputs an inverted data. The pulse selection circuit 710 has the same construction as the pulse selection circuit 510 of FIG. 6 except that it does not include a third inverter INV3. Accordingly, a detailed description of the construction of the pulse selection circuit 710 will be omitted.

The current control circuit 720 receives a bias voltage DC_BIAS, outputs a control signal CTRLS at a second level when the data is at a first level during an enable duration of the reset pulse P_RESET, and outputs the control signal at a first level when the data is at a second level during an enable duration of the set pulse, and outputs the control signal CTRLS at a third level during a disable duration of the reset pulse P_RESET and the set pulse P_SET. The current control circuit 720 has the same construction as the current control circuit 520 of FIG. 6 except that it does not contain a second level controller (e.g., LVLC2). Accordingly, a detailed description of the construction of the current control circuit 720 will be omitted.

The current drive circuit 730 outputs writing current I_BL at a first level or a second level to a phase memory array though a first node N1 during the enable duration of the reset pulse P_RESET or the set pulse P_SET respectively, in response to a logic level of (inverted) data DATA, and discharges the first node N1 (to a third voltage level) during the disable duration of the reset pulse P_RESET or the set pulse P_SET.

The current drive circuit 730 includes a second level controller LVLC2, a first pull up transistor PUTR, a second pull up transistor (e.g. transistor stack PLTR3 & PLTR4) and a pull down transistor PDTR.

The second level controller LVLC2 outputs a portion of the writing current I_BL output by the current drive circuit 730 at a first level through the first node N1 in response to the control signal CTRLS during the enable duration of the reset pulse P_RESET when the inverted data is at a second level.

The second level controller LVLC2 includes a third level transistor PLTR3 and a fourth level transistor PLTR4. The third level transistor PLTR3 has a source connected to a first voltage VDD, and a gate to which the inverted data is applied. The fourth level transistor PLTR4 has a source connected to a drain of the third level transistor PLTR3, a drain connected to the first node N1, and a gate to which the control signal CTRLS is connected.

The pull up transistor PUTR outputs the writing current I_BL at a second level through the first node N1 in response to the control signal CTRLS during the enable duration of the set pulse P_SET when the inverted data DATA is at a first level. The pull up transistor PUTR has a source connected to a first voltage VDD, a drain connected to the first node N1, and a gate to which the control signal CTRLS is applied.

The pull down transistor PDTR discharges the first node N1 during the disable duration of the reset pulse P_RESET or the set pulse P_SET irrespective of a logic level of the data DATA. The pull down transistor PDTR has a drain connected to the first node N1, a source connected to a second voltage VSS, and a gate to which an inverted signal of the reset pulse P_RESET or the set pulse P_SET is applied.

The writing driver circuit 700 of FIG. 7 differs from the writing driver circuit 600 of FIG. 6 in that data DATA is not applied to the current control circuit 720, and the inverted data DATA is input to the second level controller LVLC2 of the current drive circuit 730, such that the level of the writing current I_BL is controlled according to a logic level of the data DATA.

When the data DATA is at a second level, namely, a low level, the second inverter INV2 generates the inverted data at a first level, namely, a high level. When the inverted data DATA is at a high level, the third level transistor PLTR3 of the second level controller LVLC2 is turned off. The fourth level transistor PLTR4 is not operated.

When the data DATA is at a second level, the set pulse P_SET is applied to the first control transistor CTR1 and the second control transistor CTR2 through the second transmitter TRM2. The first control transistor CTR1 is turned on during the enable duration of the set pulse P_SET and the second control transistor CTR2 is turned off during the enable duration of the set pulse P_SET.

The first and second level transistors LTR1 and LTR2 of the first level controller LVLC1 of the current control circuit 720 are turned on by the bias voltage DC_BIAS. Accordingly, during the enable duration of the set pulse P_SET, the control signal CTRLS is applied at a first level to the pull up transistor PUTR, and the pull up transistor PUTR is turned on. The first control level of the control signal CTRLS is a level which can turn on the pull up transistor PUTR and the fourth level transistor LTR4.

The control signal CTRLS is output at a third control level during the disable duration of the set pulse P_SET or the reset pulse P_RESET irrespective of the logic level of the data DATA.

When the third and fourth level transistors PLTR3 and PLTR4 are not operated and the pull up transistor PUTR is turned on by the first control level of the control signal CTRLS, the writing current I_BL is output at a second level. Thus, the second level of the writing current I_BL is a current level, which is applied to the phase-change memory array when the set pulse P_SET is selected in the pulse selection circuit 710.

When the data DATA is at a first level, namely, a high level, the second inverter INV2 generates inverted data at a second level, namely, a low level. When the inverted data DATA is at a low level, the third level transistor PLTR3 of the second level controller LVLC2 is turned on.

When the data DATA is at a first level, the reset pulse P_RESET is applied to the first control transistor CTR1 and the second control transistor CTR2 through the first transmitter TRM1. The first control transistor CTR1 is turned on during the enable duration of the reset pulse P_RESET, and the second control transistor CTR2 is turned off during the enable duration of the reset pulse P_RESET.

The first and second level transistors LTR1 and LTR2 of the first level controller LVLC1 of the current control portion 720 are turned on by the bias voltage DC_BIAS. Accordingly, during the enable duration of the reset pulse P_RESET, the control signal CTRLS is applied at a first level to the fourth level transistor PLTR4 and the pull up transistor PUTR of the current drive circuit 730, and the fourth level transistor PLTR4 and the pull up transistor PUTR are turned on.

Since the third level transistor PLTR3 and the fourth level transistor PLTR4 are all turned on, the writing current I_BL is output at a first level. Thus, the first level of the writing current I_BL is a current level, which is applied to the phase-change memory array when the reset pulse P_RESET is selected in the pulse selection circuit 710.

The first level of the writing current I_BL is higher than the second level of the writing current I_BL.

Whether a logic level of the data DATA is a high level or a low level, the control signal CTRLS is generated at a first level, namely, a high level during the disable duration of the reset pulse P_RESET or the set pulse P_SET and turns off the pull up transistor PUTR. During the disable duration of the reset pulse P_RESET or the set pulse P_SET, the pull down transistor PDTR is turned on and discharges the first node N1.

As described above, the writing driver circuit of the present invention can select the reset pulse or the set pulse according to the logic level of the data, and control the level of current applied to the phase-change memory array according to the reset pulse or the set pulse.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A writing driver circuit of a phase-change memory array, comprising:
a pulse selection circuit that outputs a selected one of a reset pulse and a set pulse in response to a logic level of data and the data;
a current control circuit that receives a bias voltage, outputs a control signal at a second control level during an enable duration of the reset pulse when the data is at a first data level, and outputs the control signal at a first control level during an enable duration of the set pulse when the data is at a second data level; and
a current drive circuit that outputs writing current to the phase-change memory array in response to the control signal during the enable duration of the reset pulse or of the set pulse.

2. The writing driver circuit of claim 1, wherein at least one of the first control level and the second control level of the control signal increases or decreases in response to a change of the bias voltage.

3. The writing driver circuit of claim 1, wherein the enable duration of the reset pulse is shorter than the enable duration of the set pulse.

4. The writing driver circuit of claim 1, wherein a level of the writing current when the reset pulse is selected in the pulse selection circuit is higher than a level of the writing current when the set pulse is selected in the pulse selection circuit.

5. The writing driver circuit of claim 1, wherein the pulse selection circuit includes:
a first transmitter, which passes the reset pulse in response to the first logic level of the data;
a second transmitter, which passes the set pulse in response to the second logic level of the data;
a buffer that buffers the data and outputs the buffered data to the current control circuit; and
a first inverter that inverts an output of the first transmitter or the second transmitter and applies the inverted output to the current drive circuit.

6. The writing driver circuit of claim 5, wherein the first transmitter and the second transmitter include transmission gates which are turned on or off in response to the data and the inverted data, and wherein when either of the first transmitter and the second transmitter is turned on, the other transmitter is turned off.

7. The writing driver circuit of claim 6, wherein the buffer includes:
a second inverter which inverts the data to generate the inverted data; and
a third inverter which inverts the inverted data and outputs the data to the current control circuit.

8. The writing driver circuit of claim 1, wherein the current control circuit includes:
a first level controller which is turned on in response to the bias voltage and controls the level of the control signal to be generated at the first control level during an enable duration of the set pulse;
a second level controller, which controls the level of the control signal to be generated at the second control level during an enable duration of the reset pulse;
a first control transistor which activates the current control circuit in response to the reset pulse or the set pulse; and
a second control transistor which deactivates the current control circuit and outputs the control signal at a third control level during the disable duration of the reset pulse or the set pulse.

9. The writing driver circuit of claim 8, wherein the first level controller includes a first level transistor and a second level transistor which are connected in series between a drain of a first transistor and the drain of the first control transistor, the bias voltage being applied to gates of the first level transistor and the second level transistor, and the second level controller includes a third level transistor and a fourth level transistor which are connected in series between the drain of the first transistor and the drain of the first control transistor, the data being applied to gates of the third level transistor and the fourth level transistor.

10. The writing driver circuit of claim 9, wherein the first control transistor has a drain commonly connected to sources of the second and fourth level transistors, a source connected to a second voltage, and a gate to which the reset pulse or the set pulse is applied, and the second control transistor has a source connected to a first voltage, a drain connected to the drain of the first transistor, and a gate to which the reset pulse or the set pulse is applied.

11. The writing driver circuit of claim 9, wherein the current drive circuit includes:
a pull up transistor having a source connected to the first voltage, a drain connected to the first node, and a gate to which the control signal is applied; and
a pull down transistor having a drain connected to the first node, a source connected to the second voltage, and a gate to which an inverted reset pulse or an inverted set pulse is applied.

12. The writing driver circuit of claim 11, wherein the second control level of the control signal is a voltage level which turns on the pull up transistor more than the first control level of the control signal, and the third control level of the control signal is a voltage level which turns off the pull up transistor.

13. A writing driver circuit of a phase-change memory array, comprising:
 a pulse selection circuit that outputs a selected one of a reset pulse and a set pulse in response to a logic level of data;
 a current control circuit that receives a bias voltage, the data and the selected one of a reset pulse and a set pulse, and outputs a control signal at a second level when the data is at a first data level during an enable duration of the reset pulse, and outputs a control signal at a first control level when the data is at a second data level during an enable duration of the set pulse, and outputs a control signal at a third control level during a disable duration of the reset pulse or the set pulse; and
 a current drive circuit that outputs writing current at a first level or a second level to the phase-change memory array during an enable duration of the reset pulse or the set pulse respectively.

14. The writing driver circuit of claim 12, wherein the level of the at least one of the first control level and the second control level of the control signal increases or decreases in response to a change of the bias voltage.

15. The writing driver circuit of claim 12, wherein the first level of the writing current is higher than the second level of the writing current.

16. The writing driver circuit of claim 12, wherein the pulse selection circuit includes:
 a first transmitter which passes the reset pulse in response to a logic level of the data;
 a second transmitter which passes the set pulse in response to a logic level of the data.

17. The writing driver circuit of claim 16, wherein the first transmitter and the second transmitter include transmission gates which are turned on or off in response to the data, and wherein when either of the first transmitter and the second transmitter is turned on, the other transmitter is turned off.

18. The writing driver circuit of claim 13, wherein the current drive circuit includes:
 a second level controller which outputs the writing current at a first level through a first node in response to the control signal during the enable duration of the reset pulse when the inverted data is at a second level;
 a pull up transistor which outputs the writing current at a second level through the first node in response to the control signal during the enable duration of the set pulse when the inverted data is at a first level; and
 a pull down transistor which discharges the first node during the disable duration of the reset pulse or the set pulse irrespective of a logic level of the data.

19. A writing driver circuit of a phase-change memory array, comprising:
 a pulse selection circuit that receives a reset pulse and a set pulse and outputs a selected one of the reset pulse and the set pulse in response to a logic level of data;
 a current control circuit that outputs a control signal in response to the selected pulse and the data;
 a current drive circuit that outputs writing current to the phase-change memory array in response to the control signal.

20. A writing driver circuit of a phase-change memory array, comprising:
 a pulse selection circuit that receives a reset pulse and a set pulse and outputs a selected one of the reset pulse and the set pulse in response to the logic level of data;
 a current drive circuit that outputs writing current at a first level or a second level to the phase-change memory array during an enable duration of the reset pulse or the set pulse respectively;
 wherein the current drive circuit includes a first pull-up transistor and a second pull-up transistor connected in parallel between a first voltage and a first node; and wherein
 the current drive circuit outputs writing current at the first level when the first pull-up transistor is activated during an enable duration of the reset pulse; and wherein
 the current drive circuit outputs writing current at the second level when the first pull-up transistor and the second pull-up transistor are activated during an enable duration of the set pulse.

* * * * *